(12) United States Patent
Utley et al.

(10) Patent No.: US 6,456,235 B1
(45) Date of Patent: Sep. 24, 2002

(54) METHOD OF PREDICTING THE FAR FIELD PATTERN OF A SLOTTED PLANAR ARRAY AT EXTREME ANGLES USING PLANAR NEAR FIELD DATA

(75) Inventors: John P. Utley, Fullerton; Lawrence T. Uchida, Redondo Beach; Paul C. Seo, La Palma, all of CA (US); Matthew J. Sullivan, Pearl, MS (US); Richard A. Stevens, Canoga Park, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/821,568

(22) Filed: Mar. 29, 2001

(51) Int. Cl.[7] .................................................. H10Q 3/00
(52) U.S. Cl. ..................................................... 342/360
(58) Field of Search ................................. 342/153, 165, 342/174, 360, 367

(56) References Cited

U.S. PATENT DOCUMENTS 5,659,319 A * 8/1997 Rost et al. ..................... 342/36
5,754,054 A * 5/1998 Berger .......................... 324/627

* cited by examiner

Primary Examiner—Dao Phan
(74) Attorney, Agent, or Firm—Leonard A. Alkov; Glenn H. Lenzen, Jr.

(57) ABSTRACT

The far field pattern of a slotted planar array antenna is predicted at extreme angles using an improved prediction method. The prediction method acquires planar near field data for a slotted planar array antenna and then back-transforms the planar near field data to the aperture of the antenna corresponding to X position, Y position, amplitude and phase data for the array antenna. An interpolation process calculates the excitation coefficient (phase and amplitude) of each slot element of the antenna using the back-transformed data. The excitation coefficients are then processed using an array factor program to predict the far field pattern of the antenna.

5 Claims, 2 Drawing Sheets

METHOD OF PREDICTING THE FAR FIELD PATTERN OF A SLOTTED PLANAR ARRAY AT EXTREME ANGLES USING PLANAR NEAR FIELD DATA

BACKGROUND

The present invention relates generally to slotted array antennas, and more particularly, to a method of using planar near field data of a slotted antenna to predict its far field pattern at extreme angles of coverage, beyond the traditional valid angle limit.

As for prior art far field pattern prediction methods for use with slotted array antennas, depending upon the size of the test scan, the size of the antenna, the distance of the probe from the antenna and the operating frequency, a planar near field test will only be able to predict the resulted far field pattern within a limited angle of coverage. In particular, there is no known prior art relating to a method of predicting the far field pattern of a slotted planar array antenna at extreme angles using planar near field data.

Accordingly, it is an objective of the present invention to provide for a method of predicting the far field pattern of a slotted planar array antenna at extreme angles. It is a further objective of the present invention to provide for a method of predicting the far field pattern of a slotted planar array antenna at extreme angles using planar near field data.

SUMMARY OF THE INVENTION

To accomplish the above and other objectives, the present invention provides for a method of predicting the far field pattern of a slotted planar array antenna at extreme angles using planar near field data. The present invention first takes the planar near field data and back-transforms it to the aperture of the antenna using widely accepted National Institute of Standards and Technology (N.I.S.T.) codes to provide X position, Y position, amplitude and phase data for the array antenna. Then, an interpolation process is used to calculate the excitation coefficient (phase and amplitude) of each slot element of the antenna using the results obtained from the back-transform. The excitation coefficients are then used as an input to an array factor routine to predict the far field pattern of the tested antenna.

The present invention enables a user or designer to utilize a planar near field data of a slotted antenna to predict its far field pattern at extreme angle of coverage, beyond the traditional valid angle limit. Depending upon the size of the test scan, the size of the antenna, the distance of the probe from the antenna and the operating frequency, a conventional planar near field test will only be able to predict the resulted far field pattern within a limited angle of coverage. The present invention is designed to overcome this limitation.

The present invention has the advantage of overcoming the planar near field limitation of validity angle of coverage. However, the ultimate advantage that motivated the present invention is test speed. In a production environment, repeated testing is necessary to effectively diagnose and ultimately correct for test failures. This process can be very time consuming if test time is significantly lengthy. The test time for a planar near field is relatively ten times faster than that of a spherical near field. A typical test time for a planar near field test is about five minutes, compared to the typical test time of a spherical near field for the same antenna of about fifty minutes. Given this fact, one would like to use planar near field data to test and diagnose antenna test failures instead of using the much slower spherical near field testing technique.

As stated above however, the conventional planar near field test has a major limitation in that it cannot predict the far field pattern of an antenna at extreme angle of coverage. Thus if the antenna has a failure at extreme angle in the far field, the conventional planar near field cannot predict it, whereas a spherical near field test does not have this limitation. The spherical near field test however, takes ten times as long compared to a planar near field test. Therefore, to minimize test time, one would like to use the planar near field testing technique instead of the more complete, but slower spherical near field testing technique.

One might ask why spherical near field-testing be used at all since it is so time consuming? The answer is that the present invention only predicts the far field pattern results at extreme angles, and does not directly measure it. For antenna sell-off purposes, quality assurance requires that antenna performance be measured directly to verify its actual performance. Consequently, prediction is not adequate for quality assurance purposes.

Thus, the present invention enables the use of a much faster planar near field testing technique to diagnose and troubleshoot planar antennas, and then the use of a much slower but more complete spherical near field testing technique for final acceptance testing of the antenna performance.

The present invention may be use to test planar antennas including those used on the F18, F15, AV8B, F14D, AMRAAM, Phalanx, and Standard missile antennas manufactured the assignee of the present invention, along with any other planar slotted array antenna.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figures 1, 2:
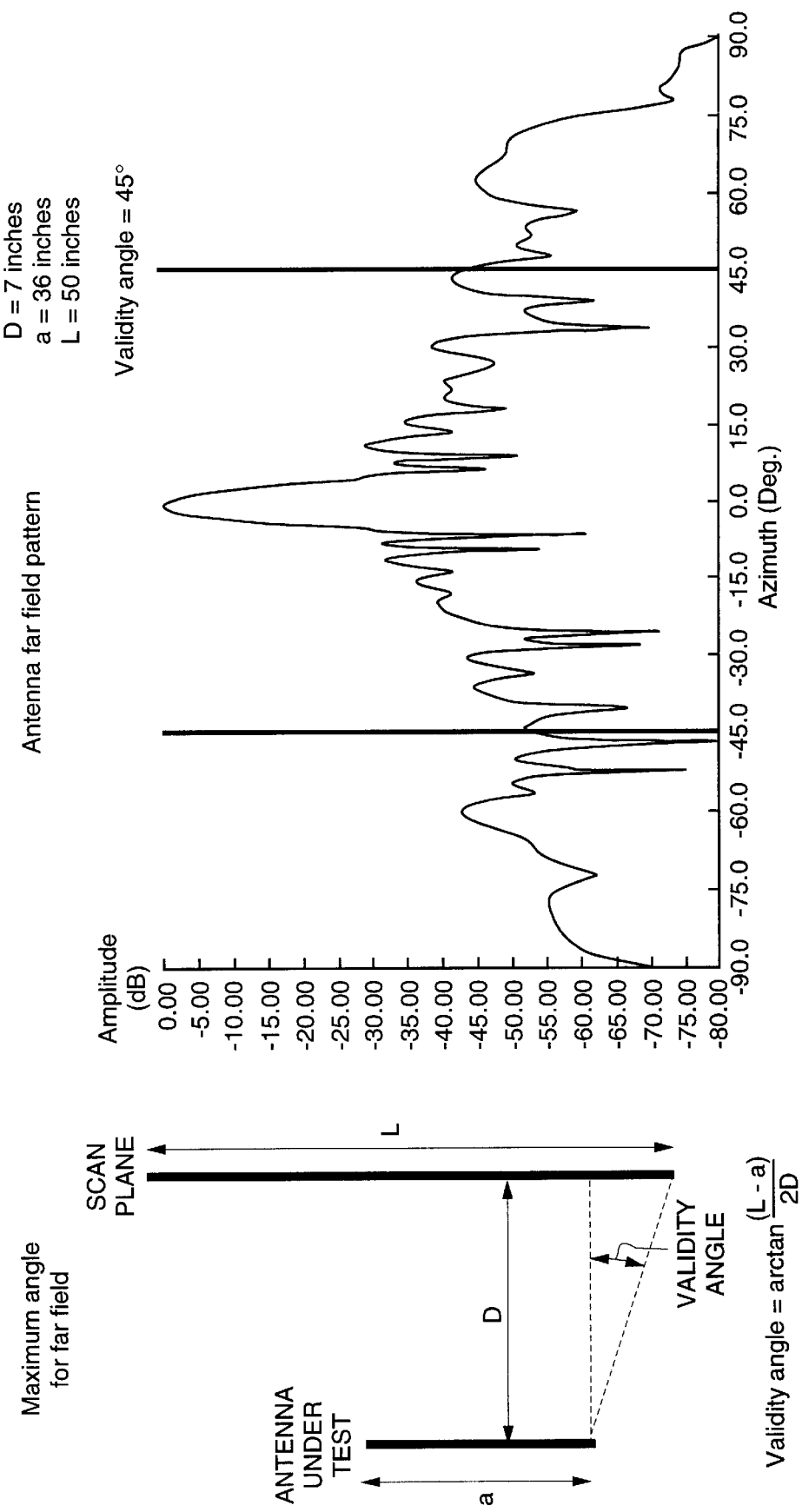
FIG. 1 illustrates the geometry showing the far field validity angle for which a conventional planar near field test can predict.
FIG. 2 is a graph showing the antenna far field pattern for a typical planar slotted antenna.

Referring to the drawing figures, FIG. 1 illustrates the geometry showing the far field validity angle for which a conventional planar near field test can predict. FIG. 2 is a graph showing the antenna far field pattern for a typical planar slotted antenna. The validity angle for the tested antenna is 45 degrees. As was mentioned previously, the conventional planar near field test can only accurately predict the far field pattern out to the 45 degree validity angle. The present invention overcomes this limitation and can predict the far field pattern out to a 90-degree angle.

Figure 3:
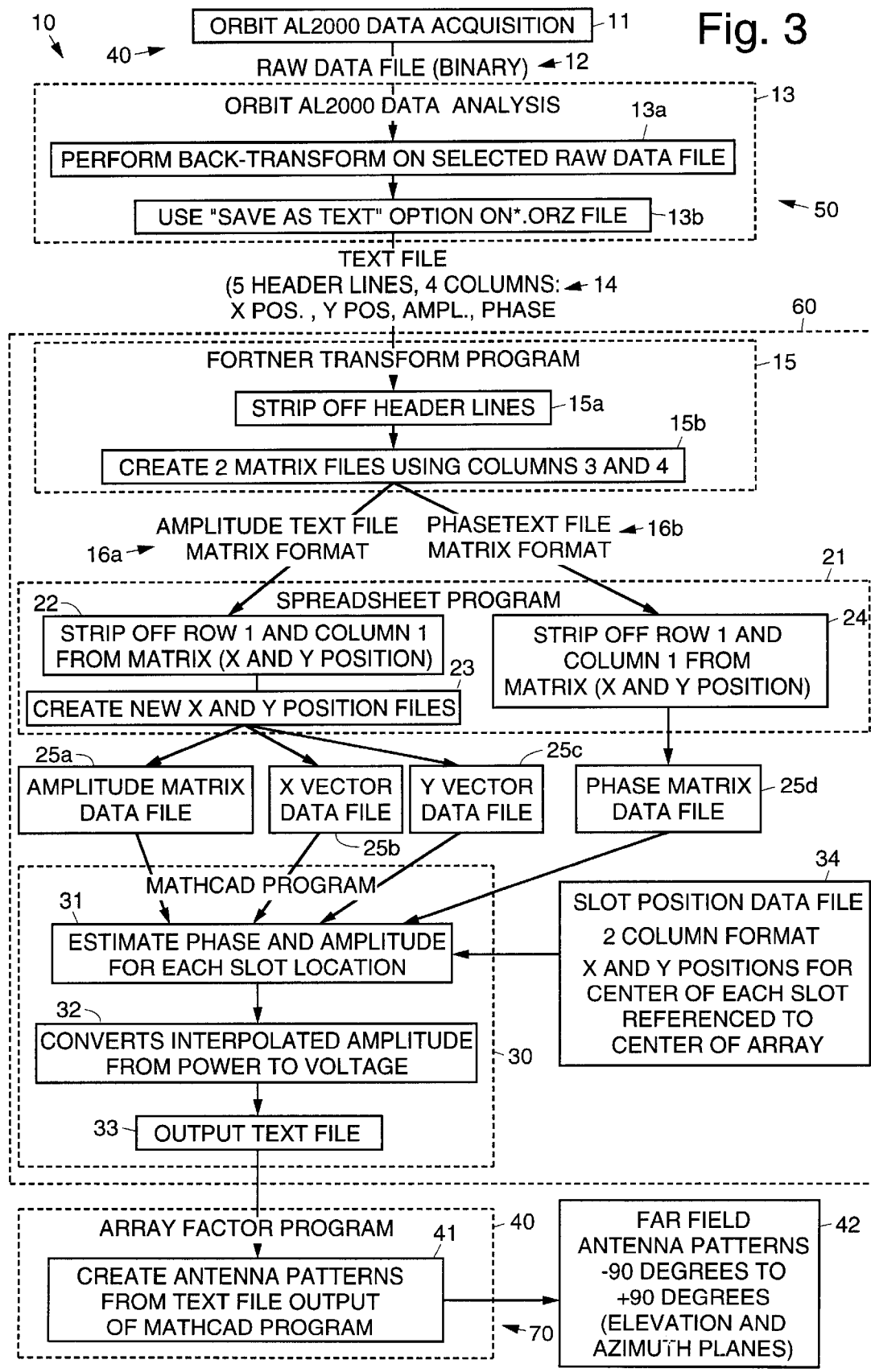
FIG. 3 is a flow diagram illustrating an embodiment of a prediction method in accordance with the principles of the present invention.

FIG. 3 is a flow diagram illustrating an exemplary embodiment of a prediction method 10 in accordance with the principles of the present invention. In general, the prediction method 10 acquires 40 planar near field data for a slotted planar array antenna and then back-transforms 50 the planar near field data to the aperture of the antenna using National Institute of Standards and Technology (N.I.S.T.) codes corresponding to X position, Y position, amplitude and phase data for the array antenna. Then, an interpolation process 60 is used to calculate the excitation coefficient (phase and amplitude) of each slot element of the antenna using the results obtained from the back-transform. The excitation coefficients are then used as an input to an array factor process 70 to predict the far field pattern of the antenna.

More specifically, and with reference to FIG. 1, the method 10 starts with planar near field data acquisition 11 using an AL2000 data acquisition and analysis system manufactured by Orbit, for example. A binary raw data file 12 is output by the data acquisition portion of the system and is input to a data analysis portion of the system. A back-ransform 13a is performed on the raw data file 12 which produces an "*.ORZ" file which comprises data corresponding to X position, Y position, amplitude and phase of the tested planar grid. A "Save as Text" option 13b is used to save the back-transformed "*.ORZ" file as a text file 14. The text file 14 has five header lines, four columns of data including X position, Y position, amplitude and phase.

The text file 14 is then processed using a Fortner transform program 15 which strips off 15a the header lines, and creates 15b two matrix files using columns three and four of the text file 14. The first file is an amplitude text file 16a in matrix format, and the second file is a phase text file 16b in matrix format.

A spreadsheet program 21 such as Microsoft Excel, for example, is then used to process the amplitude and phase text files 16a, 16b. Using the spreadsheet program 21, row one and column one from the matrix (the X and Y positions) are stripped 22 from the amplitude text file 16a, and new X and Y position files are created 23. This produces an amplitude matrix data file 25a, an X vector data file 25b, and a Y vector data file 25c. Row one and column one from the matrix (the X and Y positions) are also stripped 24 from the phase text file 16b. This produces a phase matrix data file 25d.

Data from the four text files 25a–25d along with a slot position data file 34 are then processed using a mathematical analysis program 30 such as MathCad or Mathematica, for example. The slot position data file 34 has a two column format containing X and Y position for the centers of each slot along with measurement values referenced to the center of the antenna array. For example, using the Mathcad program, the phase and amplitude is estimated 31 for each slot location. Then the MathCad program converts 32 an interpolated amplitude from a power value to a voltage value and outputs 33 a text file. The text file is processed by an array factor program 40 which creates 41 and antenna patterns from the text file output of the MathCad program. The resulting output of the array factor program 40 comprises far field antenna patterns 42 from −90° to +90° in elevation and azimuth planes. Thus, the present method 10 generates far field patterns including extreme angles of coverage, well beyond those generated using conventional methods.

The unique part of the present method 10 is contained in the MathCad program and Array Factor program portions thereof. In the MathCad program, the two-dimensional polynomial interpolation algorithm used therein has been modified to compensate for far field antenna pattern inconsistencies. In the array factor program, the 'element' factor has been modified to provide a better match to the performance of the slotted array. The basic procedure is well known to those skilled in the antenna testing art. Those skilled in the antenna have heretofore used conventional array factor programs to test antennas, and in particular in predicting the antenna patterns thereof.

The method 10 of the present invention is not a closed solution for predicting the far field pattern of the antenna. That is, the method 10 does not predict the correct or actual far field pattern the first time the method 10 is performed. To implement the method 10, data indicative of a known far field antenna pattern for a particular type of antenna is obtained, such as for a slotted array, which is used as a reference. Then, the far field pattern of a slotted array test antenna is predicted using the Array Factor program. The Array Factor program uses two parameters: an array factor and an element factor to calculate the antenna far field pattern. The array factor is a function of the position and number of slots (i.e., the pattern of slots) of the antenna. The element factor is used to model the beamwidth of the radiating element pattern. Normally, the element factor is based on the use of a cosine function at all angles between 0 and 90 degrees.

However, in accordance with the present invention, the element factor is modified by using a cosine function close to boresight (between 0 and 45 degrees, for example), and a $\cos^2$ function at larger angles away from boresight (between 45 and about 65 degrees, for example). In the Array Factor program, the element factor is not used above an angle of about 65 degrees to model the beamwidth of the antenna pattern. The specific angle above which element factor is not used is empirically determined and depends upon the type of antenna that is tested.

In implementing the method 10, an empirical process is employed using the modified Array Factor program that iteratively adjusts parameters of the element factor in order to converge on the correct far field antenna pattern for the particular type of antenna that is tested. Thus, the element factor is adjusted until the desired (known) far field pattern for the tested antenna is obtained.

The present invention has been tested using an F18 antenna array manufactured by the assignee of the present invention, and the results indicate good agreement between predicted and actual far field patterns.

Thus, a method has been disclosed for predicting the far field pattern of a slotted planar array antenna at extreme angles using planar near field data. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A method for predicting the far field pattern of a slotted planar array antenna at extreme angles, said method comprising the steps of:

acquiring planar near field data for a slotted planar array antenna;

back-transforming the planar near field data derived from National Institute of Standard and Technology codes to an aperture of the slotted planar array antenna to provide X position, Y position, amplitude and phase data for the array antenna;

processing the back-transformed X position, Y position, amplitude and phase data using an interpolation process to calculate the phase and amplitude excitation coefficients of each slot element of the antenna; and processing the phase and amplitude excitation coefficients using an array factor process to predict the far field pattern of the antenna.

2. The method of claim 1 wherein the interpolation process comprises the steps of:

processing the back-transformed X position, Y position, amplitude and phase data using a Fortner transform program to generate an amplitude text file 16*a* in matrix format, and a phase text file in matrix format;

processing the amplitude and a phase text files to produce an amplitude matrix data file, an X vector data file, a Y vector data file, and a phase matrix data file; and processing data contained in the amplitude matrix data file, the X vector data file, the Y vector data file, and the phase matrix data file, and a slot position data file defining X and Y positions for centers of each slot referenced to the center of the array antenna to generate the phase and amplitude excitation coefficients of each slot element of the antenna.

3. The method of claim 2 wherein the step of processing the data contained in the data files comprises the step of processing the data using a mathematical analysis program having a two-dimensional polynomial interpolation algorithm that is modified to compensate for far field antenna pattern inconsistencies.

4. The method of claim 3 wherein the two-dimensional polynomial interpolation algorithm of the mathematical analysis program is modified by using a cosine function close to boresight and a $\cos^2$ function at larger angles away from boresight.

5. The method of claim 1 wherein the array factor process has an element factor that is modified to provide a better match to the performance of the slotted array.

* * * * *